United States Patent
Currò

(10) Patent No.: US 7,344,966 B2
(45) Date of Patent: Mar. 18, 2008

(54) MANUFACTURING METHOD FOR A POWER DEVICE HAVING AN AUTO-ALIGNED DOUBLE THICKNESS GATE LAYER AND CORRESPONDING DEVICE

(75) Inventor: Giuseppe Currò, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 139 days.

(21) Appl. No.: 10/901,920

(22) Filed: Jul. 29, 2004

(65) Prior Publication Data

US 2005/0059195 A1    Mar. 17, 2005

(30) Foreign Application Priority Data

Jul. 31, 2003   (EP)   ................................. 03425526

(51) Int. Cl.
*H01L 21/3205*   (2006.01)
*H01L 21/4763*   (2006.01)
*H01L 21/8234*   (2006.01)
*H01L 21/336*   (2006.01)

(52) U.S. Cl. ...................... 438/585; 438/275; 438/287; 438/289

(58) Field of Classification Search ................ 438/585, 438/289, 591, 595, 275, 288, 277, 276, 305
See application file for complete search history.

(56) References Cited

U.S. PATENT DOCUMENTS

| | | | | |
|---|---|---|---|---|
| 5,895,955 | A * | 4/1999 | Gardner et al. | 257/336 |
| 6,261,978 | B1 * | 7/2001 | Chen et al. | 438/224 |
| 6,784,060 | B2 * | 8/2004 | Ryoo | 438/275 |
| 6,815,299 | B2 * | 11/2004 | Kiritani | 438/305 |
| 6,853,037 | B2 * | 2/2005 | Kudo et al. | 257/369 |
| 6,888,205 | B2 * | 5/2005 | Moscatelli et al. | 257/406 |
| 2002/0140042 | A1 * | 10/2002 | Stout | 257/401 |
| 2003/0141559 | A1 * | 7/2003 | Moscatelli et al. | 257/406 |

* cited by examiner

*Primary Examiner*—Chuong A. Luu
(74) *Attorney, Agent, or Firm*—Lisa K. Jorgenson; Robert Iannucci; Seed IP Law Group PLLC

(57) ABSTRACT

A manufacturing method for a power device integrated on a semiconductor substrate with double thickness of a gate dielectric layer is described, which comprises the following steps: forming first dielectric portions having a first thickness; forming on the whole semiconductor substrate a first dielectric layer thinner than the first dielectric portions; forming a conductive layer on the first dielectric layer; forming a second dielectric layer on the conductive layer; performing an etching step of the second dielectric layer and of the conductive layer to form first spacers and a gate electrode, to define, between the gate electrode and the substrate, second dielectric portions in the first dielectric layer, the second dielectric portions being auto-aligned with the first portions.

29 Claims, 3 Drawing Sheets

MANUFACTURING METHOD FOR A POWER DEVICE HAVING AN AUTO-ALIGNED DOUBLE THICKNESS GATE LAYER AND CORRESPONDING DEVICE

BACKGROUND OF THE INVENTION

1. Field of the Invention

The present invention relates to a manufacturing method for a power device having an auto-aligned double thickness gate dielectric layer and corresponding device.

The invention also relates to a power device integrated on a semiconductor substrate comprising a gate electrode formed above a channel region formed in said semiconductor substrate and insulated therefrom by means of a gate dielectric layer.

The invention particularly, but not exclusively, relates to a manufacturing method of a VDMOS power device and the following description is made with reference to this field of application for convenience of illustration only.

2. Description of the Related Art

As it is well known, the planar and vertical size decrease and the subsequent power device integration density increase involves the need to reduce the driving potentials of these devices in order to save the strength and integrity thereof. A particularly important class of silicon power devices are PowerMOSFETs which must generally meet very strict requirements in terms of minimum on state resistance and high switching speed in switching applications.

Moreover, it is important to succeed in driving these devices with very low voltages (logic or superlogic level) in order to reduce also the power consumption.

On the technological level, the need to reduce more and more a Power MOSFET operating resistance has led to a new design of the MOS capacitor structure which is formed between the gate electrode, the substrate and the gate dielectric layer interposed between these layers, and which is responsible for the switching functions themselves.

In particular, the gate dielectric layer thickness, traditionally silicon oxide, is more and more reduced in order to obtain threshold voltage values being even lower than 1 Volt without degrading excessively the breakdown strength of the diffused channel, channel which is moreover designed in order to be always as short as possible. Nevertheless, such a technological choice as the just mentioned one has some important drawbacks. In terms of switching speed, in fact, the reduction of the gate dielectric layer thickness, together with the increase in the gate electrode area being intrinsic in the higher integration density, involves lower transistor device performances because of the increased input and transition capacitive components.

Moreover, in some more and more important applications wherein the device must integrally support the action of ionized environmental agents, for example in satellites or high nuclear radiation concentration environments, an excessive reduction of the involved geometries and of the gate dielectric layer thickness can generate a considerable device weakening with respect to the action of very energetic heavy ions passing through the device and capable of depositing very high amounts of energy/charge in the active region of the device itself.

A prior art solution to meet this requirement to form thin, but radiation-resistant, gate dielectric layers, provides the integration in traditional MOS devices of gate dielectric layers being different from thermal silicon oxide ($SiO_2$) such as for example hafnium oxide, aluminum oxide or silicon oxide/silicon nitride multilayers.

Although advantageous in many aspects, this first solution has several drawbacks connected to the use of alternative materials whose use at industrial level involves long implementation steps being subject to tests which might require prohibitive times for the present market of the devices concerned.

BRIEF SUMMARY OF THE INVENTION

One embodiment of the present invention provides a power device having a fast switching and a high tolerance to the trigger of gate dielectric layer hard breakdown mechanisms, this device being manufactured with the lowest number of process steps and having such structural and functional features as to allow a very compact device to be obtained, overcoming the limits and drawbacks still affecting prior art devices.

In particular, one embodiment of the present invention provides a power device integrated on a semiconductor substrate comprising a gate electrode, and a channel region formed in the semiconductor substrate, wherein the gate electrode is insulated from the latter by means of a gate dielectric layer, which comprises a first dielectric portion having a first thickness, and a second dielectric portion having a second thickness being lower than the first one, said first dielectric portion and second dielectric portion being auto-aligned with each other.

Another embodiment of the present invention provides a method of manufacturing a power transistor device having a "totally auto-aligned" double thickness gate dielectric layer in active area. Advantageously, in the transistor device manufacturing, a single photolithography step is used to define the configuration of a thick gate dielectric layer portion.

In particular, one embodiment of the present invention provides a manufacturing method for a power device integrated on a semiconductor substrate having a gate dielectric layer with double thickness, comprising the following steps: forming first dielectric portions on said substrate having a first thickness, each of said first dielectric portion having an upper surface; forming on said semiconductor substrate uncovered by said first dielectric portions a first dielectric layer thinner than said first dielectric portions; forming a conductive layer on said first dielectric layer; forming a second dielectric layer on said conductive layer; and performing an etching step of said second dielectric layer and of said conductive layer to form first spacers and a gate electrode having a top, to define, between said gate electrode and said substrate, second dielectric portions in said first dielectric layer, said second dielectric portions being auto-aligned with said first portions.

The features and advantages of the method and device according to the invention will be apparent from the following description of an embodiment thereof given by way of non-limiting example with reference to the attached drawings.

DETAILED DESCRIPTION OF THE INVENTION

With reference to these drawings, a MOS transistor electronic device, in particular of the VDMOS type, manufactured according to the method of the present invention, is globally and schematically indicated with D.

The process steps and the structures described hereinafter do not form a complete process flow for manufacturing integrated circuits. In fact, the present invention can be implemented together with the integrated circuit manufacturing techniques presently used in this field and only those commonly used process steps which are necessary to understand the invention are described hereinafter.

The figures representing cross sections of device portions during the manufacturing are not drawn to scale, but they are drawn instead in order to show the important features of the invention.

Figure 7:
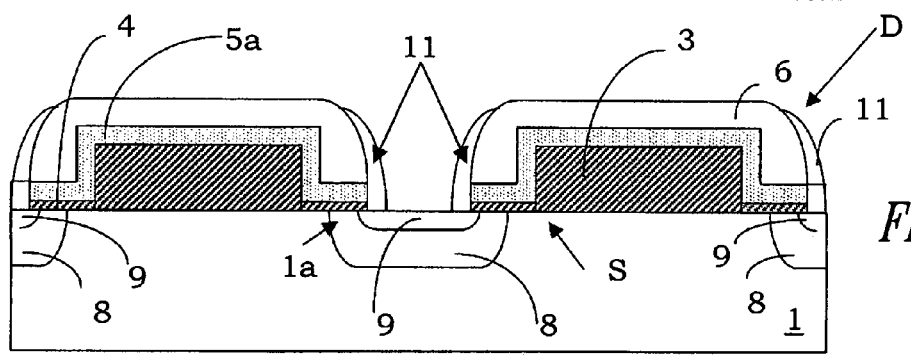

With reference to FIG. 7, a transistor device D formed on a semiconductor material substrate 1 is shown. In particular, the device D can be a power device formed in the MOS technology with a central gate electrode 5a and respective source regions 9 located on opposite sides with respect to the gate electrode 5a. These source regions 9 are completely contained in respective body regions 8.

The gate electrode 5a is formed above a channel region 1a formed in the semiconductor substrate 1 and insulated from the latter by interposing a gate dielectric layer S. This gate dielectric layer S comprises a first dielectric portion 3 of a first thickness and a second dielectric portion 4a of a second thickness. In other words, the gate dielectric layer S has a double thickness. In particular, the first dielectric portion 3 is thicker than the second dielectric portion 4a. Moreover, the first dielectric portion 3 and the second dielectric portion 4a are auto-aligned with each other.

The second portion 4a is also aligned with the gate electrode 5a in correspondence with the source 9 and channel 1a regions.

The whole gate electrode 5a is covered on top by a dielectric layer 6. The device D is then completed by spacers 11 formed on the side walls of the electrode 5a and on the dielectric layer 6.

Figure 8:
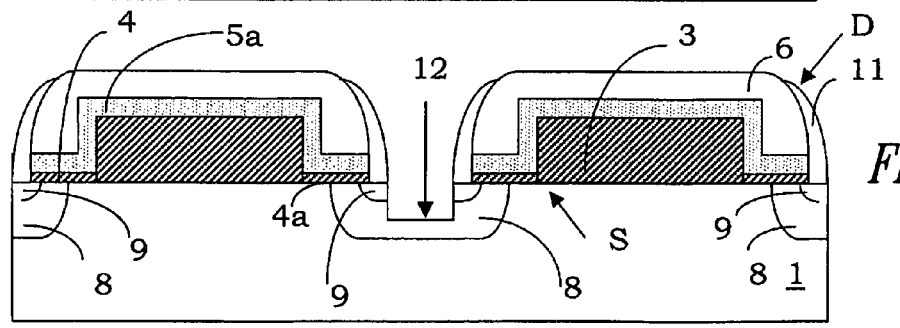

Advantageously, a soft trench 12 is formed in the substrate 1 aligned with spacers 11, as shown in FIG. 8.

The device D is then traditionally completed by forming a drain electrode behind the substrate 1, not shown in the drawings.

Figure 11:
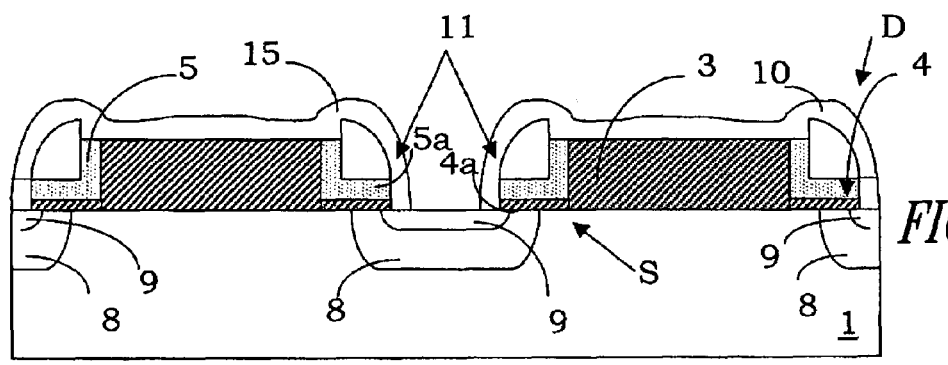
Figure 12:
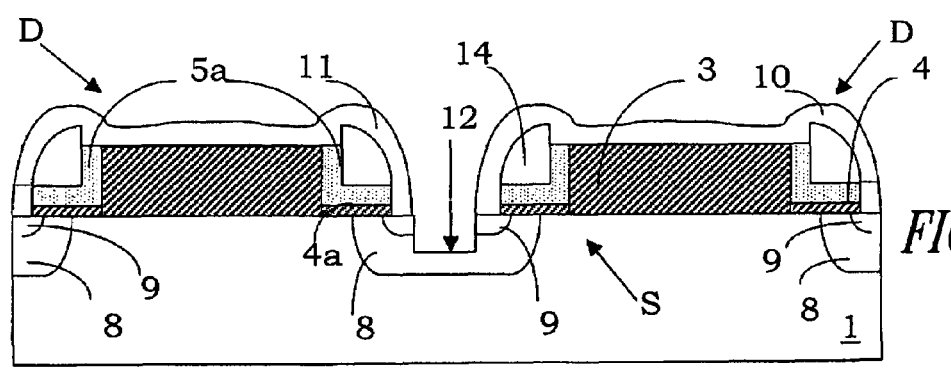

With reference to FIG. 11, a second embodiment of the device D according to the invention is described.

In this embodiment, the gate electrode 5a is not present on the upper surface of the first dielectric portion 3, but it is present only on the side walls of this first dielectric portion 3.

Figure 10:
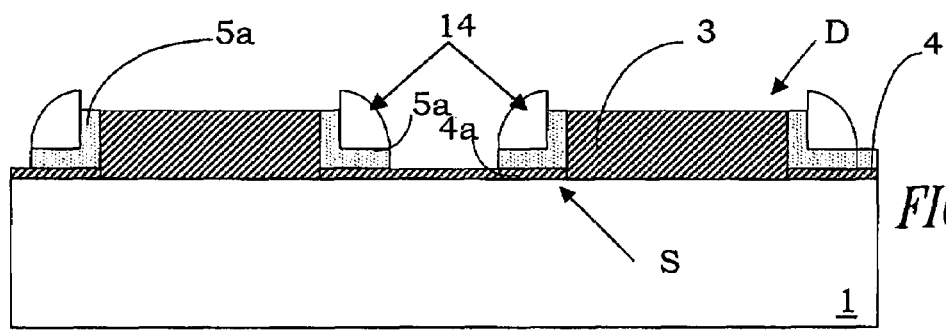

First spacers 14 are then formed on the gate electrode 5a, as shown in FIG. 10. The device D is then completed by second spacers 11 formed on the side walls of the electrode 5a and they cover at least partially the first spacers 14. These second spacers 11 are formed in a dielectric layer 10 covering the top of both the gate electrode 5a and the first dielectric portions 3.

In this embodiment too, advantageously, a soft trench 12 is formed in the substrate 1 aligned with the second spacers 11.

A first embodiment of the manufacturing method of the device D according to the invention is now described.

Convenient edge terminals, not shown in the figures, are traditionally formed on a semiconductor substrate 1.

A thin dielectric layer, for example, thermal oxide with a thickness being lower or equal to 100 nm, can be formed on the semiconductor substrate 1, not shown in the figures.

According to the invention, a thick gate dielectric layer 2 is formed on the substrate 1, for example through CVD (Chemical Vapor Deposition) deposition. (See, FIG. 1)

The thick dielectric layer 2 is for example a USG (Undoped Silicon Glass), PSG (Phospho-Silicate Glass), BPSG (Boro-Phospho-Silicate Glass), TEOS (Tetraethyl Orthosilicate), SOG (Spin on Glass), silicon nitride layer, or a multilayer comprising a sequence of these layers.

Advantageously, the thickness of this dielectric layer 2 ranges from 100 to 1000 nm.

A thermal densifying process of the thick dielectric layer 2 is then advantageously performed.

Figure 1:
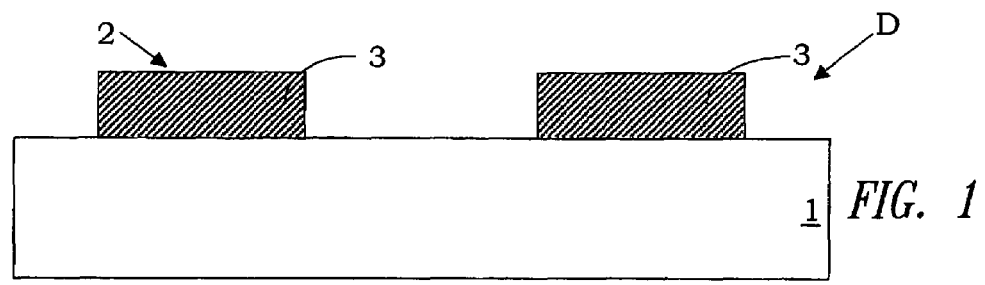
FIGS. 1 to 8 show schematical views in vertical section and in enlarged scale respectively of a vertical-type MOS device undergoing different steps of a first embodiment of the manufacturing method according to the invention.

As shown in FIG. 1, through a traditional photolithographic technique, a plurality of first dielectric portions 3 is defined from the thick dielectric layer 2.

Advantageously, the etching step of this thick dielectric layer 2 is performed through an unidirectional etching with final end point on the semiconductor substrate 1.

Advantageously, a cleaning step is performed on the whole semiconductor device to prepare the manufacture of a second dielectric layer.

Figure 2:
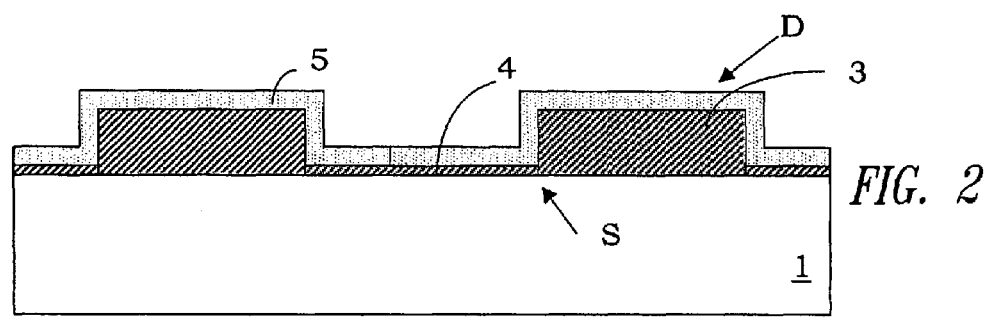

As shown in FIG. 2, a first dielectric layer, also referred herein as a thin gate dielectric layer 4, is then formed on the whole substrate in the regions not covered by the first portions 3. For example this thin gate dielectric layer 4 is formed through thermal oxidation or it can be formed by means of an oxinitride layer or an oxide/nitride/oxide multilayer. Advantageously, the thickness of the thin gate dielectric layer 4 is lower or equal to 100 nm.

Figure 3:
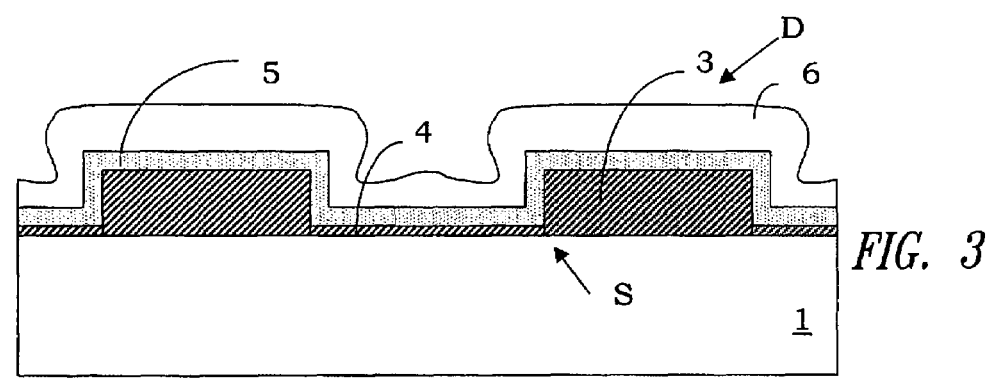

A conductive layer 5 is then formed on the whole device to manufacture gate electrodes as shown in FIG. 3. For example, a doped polysilicon layer, or a double polysilicon/metallic silicide layer is deposited. The thickness of this conductive layer 5 is compatible with the planar geometries and the auto-alignment requirements of the manufacturing process.

A further dielectric layer 6 is formed on the whole device for example through CVD (Chemical Vapor Deposition) deposition. The dielectric layer 6 is for example a dielectric layer or multilayer of low conformality such as USG (Undoped-Silicate Glass), PSG (Phospho-Silicate Glass), and TEOS (Tetraethyl Orthosilicate). The dielectric layer is formed through convenient deposition techniques. The thickness of this dielectric layer 6 depends on the planar geometry and the project channel length.

Advantageously, having the dielectric layer 6 at a low conformality, the thickness of this dielectric layer 6 in correspondence with and above the thin layer 4 is less than that of the layer 6 formed in correspondence with and above the portions 3 of the thick dielectric layer 2, as shown in FIG. 3.

Figure 4:
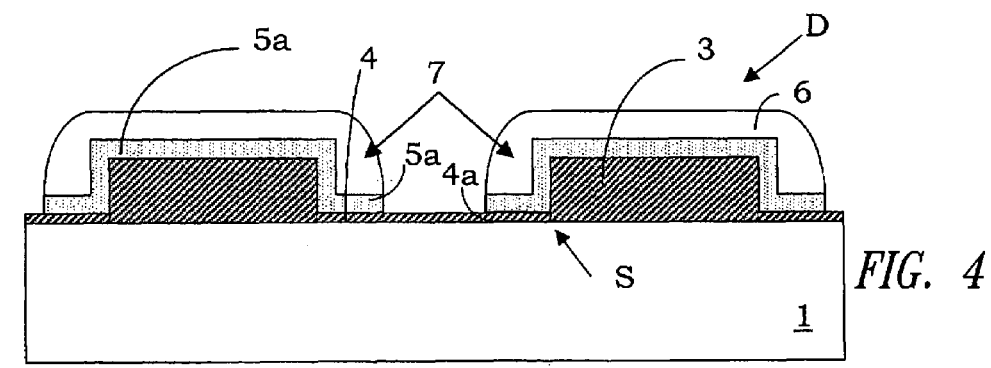

An etching step of the dielectric layer 6 is then performed. For example this etching step is of the unidirectional type, with end point on the conductive layer 5. First spacers 7 are formed therefore on the conductive layer 5 in correspondence with the side walls of the portions 3, as shown in FIG. 4.

Advantageously, this dielectric layer 6, after the etching step, though covering a portion of the conductive layer 5 located in correspondence with the upper surface of the first portions 3, is completely removed from further portions of the conductive layer 5 located in correspondence with the thin dielectric layer 4 and uncovered by the first spacers 7.

An etching step of the conductive layer 5 uncovered by the first spacers 7 is then performed. A portion 5a of the conductive layer 5 which is therefore defined between these spacers 7 and the substrate forms the gate electrode of the final device, as shown in FIG. 4.

Figure 5:
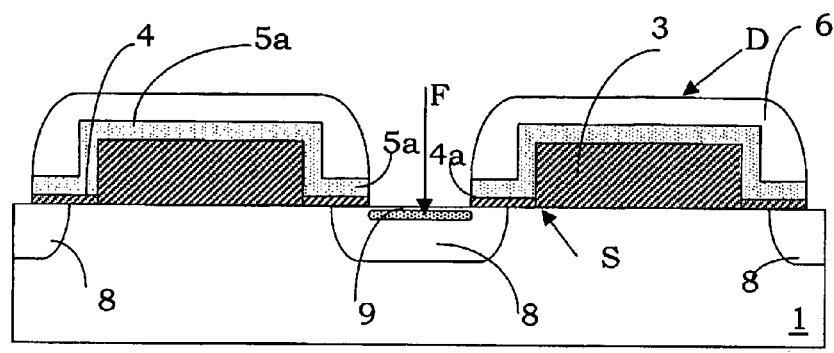

Advantageously, this etching step is of the unidirectional type and it is timed or end point performed on the thin gate dielectric layer 4. Second dielectric portions 4a of the thin gate dielectric layer 4 are thus defined as between the gate electrode 5a and the semiconductor substrate 1, as shown in FIG. 5.

The first dielectric portions 3 and the second dielectric portions 4a form the gate dielectric layer S of the final device D.

A body region 8 is then formed, for example by performing a ionic implant in the substrate 1 and further diffusing said implanted region 8.

Advantageously, an etching step of the residual thin gate dielectric layer 4 is then performed to uncover the substrate 1. This etching step is, for example of the dry type and timed.

A source region 9 is then formed, for example by performing a further ionic implant F in the substrate 1, as shown in FIG. 5.

Figure 6:
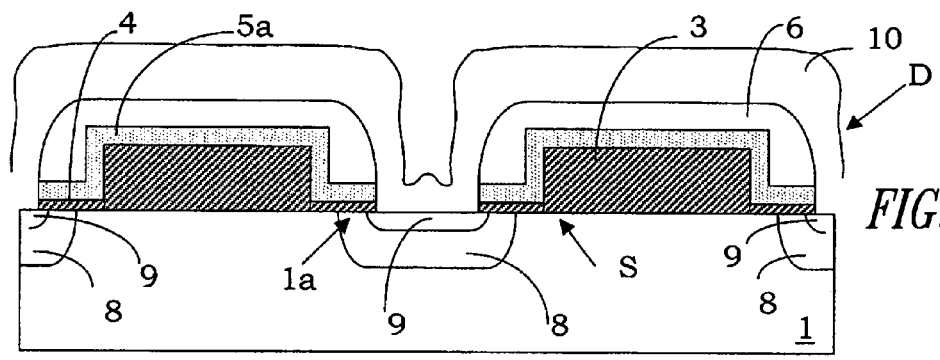

A further dielectric layer 10 is formed, on the whole device, for example through CVD (Chemical Vapor Deposition) deposition, as shown in FIG. 6.

The dielectric layer 10 is, for example a dielectric layer or multilayer of low conformality, such as USG (Undoped-Silicate Glass), PSG (Phospho-Silicate Glass), and TEOS (Tetraethyl Orthosilicate). The dielectric layer is formed through convenient deposition techniques. The thickness of this dielectric layer 10 depends on the planar geometry of the device D.

A diffusion step of the source region 9 and a densifying step of the last dielectric layer 10 are then performed, as shown in FIG. 6.

An etching step of this last dielectric layer 10 is then performed to form second spacers 11. This etching step is for example of the unidirectional type with final end point on the semiconductor substrate, as shown in FIG. 7.

An advantageous embodiment of the device according to the invention provides the formation of a body/source contact soft trench 12 which is auto-aligned with the second spacers 11.

The presence of a soft trench in the source/body diffusion region allows a metalization contact to be formed on both source and body wells being extended on the whole active cell perimeter. Therefore, it avoids a prior photolithographic step, which selects the active cell area fraction being concerned by the source implant. Therefore the periphery of said channel region, which will obviously be equal to the perimeter of the gate electrode, is maximized.

Finally, a strengthening of the device with respect to the destructive triggering of parasite elements in the active area is basically obtained.

The device D is then completed with traditional process steps providing:
  pad contact photolithography;
  front device metalization;
  preparation and metalization of the back wafer to form the device drain region.

This first embodiment allows a device D to be obtained with low resistance of the gate electrode 5a, covering completely the first portions 3.

A second embodiment of the manufacturing method of the device D according to the invention is now described.

In particular, the process steps up to the deposition of the conductive layer 5 on the whole semiconductor substrate are the same as in the previous embodiment, whereby the first dielectric portions 3, and the thin, first dielectric layer 4 are formed on a substrate 1.

Figure 9:
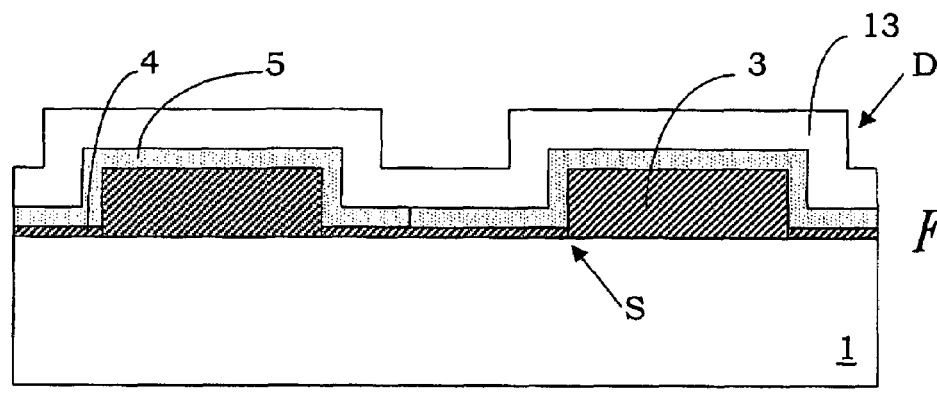
FIGS. 9 to 12 show schematical views in vertical section and in enlarged scale respectively of a MOS device undergoing different steps of a second embodiment of the manufacturing method according to the invention.

A second dielectric layer 13 is then formed on the conductive layer 5, for example through CVD deposition, as shown in FIG. 9.

The second dielectric layer 13 is, for example a dielectric layer or multilayer of high-conformality, such as USG (Undoped-Silicate Glass), PSG (Phospho-Silicate Glass), and TEOS (Tetraethyl Orthosilicate) formed through convenient deposition techniques. The thickness of this dielectric layer 13 depends on the planar geometry and the project channel length.

Having the second dielectric layer 13 of high conformality, the thickness of this layer is uniform on the whole device D.

An etching step, for example unidirectional, of the second dielectric layer 13 is performed at end point on the conductive layer 5 to form a first spacer 14, as shown in FIG. 10. A portion 5a of the conductive layer 5 which is therefore defined between these spacers 14 and the substrate 1 forms the gate electrode.

This etching step is then followed by a further etching step, for example unidirectional, of the gate electrode (multi) layer, timed or with end point on the thin gate dielectric layer 4, as shown in FIG. 11. Second dielectric portions 4a of the gate dielectric layer are therefore defined as between the gate electrode 5a and the substrate 1.

The process flow is completed as in the previous embodiment starting from the deposition of the dielectric layer 10 to form second spacers 11.

In particular, in this embodiment the dielectric layer 10 is not removed from the upper surface of the first dielectric portion 3 and it covers the top of both the gate electrode 5a and the first dielectric portions 3.

Advantageously, in this second embodiment the removal of the gate electrode covering the thick dielectric portions 3 ensures a better gate/source side insulation quality because of the higher usable thickness of the second dielectric layer 10.

The present invention applies to VDMOS power devices of both types of polarity with any edge terminal structure and with cell in active area of any shape and size.

The method according to the invention can be advantageously applied to signal VDMOS, IGBT and VDMOSFET devices, both of the P— and of the N-type.

Both embodiments described can be also used to define photolithographically active area contacts, i.e., without auto-aligned formation of the second spacer. Obviously in this case size limits of the width of the device D or elementary cell are largely imposed by the definition and alignment specifications of the photoexposure equipment used. Nevertheless, an evident advantage mainly in the second embodiment, wherein the gate electrode overlapped to the thick dielectric portion 3 also called intercell is removed, is the higher insulation quality between gate electrode and source region because of, as already mentioned, the higher dielectric layer 10 thickness which can be used in this embodiment.

In conclusion, by manufacturing a device D, with a gate dielectric layer S comprising two portions 3 and 4a with different thicknesses and auto-aligned with each other, photolithographic steps are not used for defining single elements composing the device, such as for example the gate electrode. This allows for a very compact device D to be manufactured with no need to provide alignment tolerances required to perform the following photolithographic steps thus allowing a device D with a symmetrically diffused channel and lengths of even 0.1-0.5 µm to be manufactured.

In particular, the removal of the photolithographic definition step of the gate electrode is allowed by exploiting the low conformality of the CVD silicon oxide layer 4, for example USG, connected in turn to the thick dielectric layer 2 height and to the width of the device D or active cell (aspect ratio).

Moreover, the self-alignment of the pattern of the gate electrode and mainly of the source and body region diffusions makes the definition of the photolithography itself less critical in forming the initial thick dielectric layer portions 3.

From the foregoing it will be appreciated that, although specific embodiments of the invention have been described herein for purposes of illustration, various modifications may be made without deviating from the spirit and scope of the invention.

The invention claimed is:

1. A manufacturing method, comprising:
   forming, on a semiconductor substrate, first dielectric portions having a first thickness, each first dielectric portion having an upper surface;
   forming, on portions of said semiconductor substrate not covered by said first dielectric portions, a first dielectric layer thinner than said first dielectric portions;
   forming a conductive layer on said first dielectric layer and said first dielectric portions;
   forming a second dielectric layer on said conductive layer;
   anisotropically etching said second dielectric layer without a photolithographic pattern, the anisotropically etching step forming first dielectric spacers on side portions of the conductive layer;
   etching said conductive layer while using the first dielectric spacers as a mask, the etching said conductive layer forming, from the conductive layer, a first gate electrode having a top and a lateral edge substantially aligned with a lateral edge of one of the first dielectric spacers; and
   defining, between said first gate electrode and said substrate, second dielectric portions in said first dielectric layer, said second dielectric portions being in contact with said first dielectric portions, wherein defining the second dielectric portions includes etching the first dielectric layer using the first dielectric spacers as a mask, the defining the second dielectric portions resulting in each of the second dielectric portions having a lateral edge substantially aligned with a corresponding lateral edge of the first dielectric spacers.

2. A manufacturing method according to claim 1 wherein said second dielectric layer is formed in a non-conforming manner.

3. A manufacturing method according to claim 1 wherein said second dielectric layer is formed in a conforming manner.

4. A manufacturing method according to claim 3 wherein said anisotropically etching step removes said second dielectric layer from upper surfaces of the conductive layer above the first dielectric portions and said etching said conductive layer removes the conductive layer from the upper surfaces of said first dielectric portions and forms the first gate electrode on a side wall of one of the first dielectric portions.

5. A manufacturing method according to claim 4, further comprising:
   depositing a third dielectric layer on said semiconductor substrate.

6. The method of claim 1 wherein the etching said conductive layer step forms the first gate electrode along, and in contact with, a first side wall of one of the first dielectric portions.

7. A manufacturing method, comprising:
   forming, on a semiconductor substrate, first dielectric portions having a first thickness, each first dielectric portion having an upper surface;
   forming, on portions of said semiconductor substrate not covered by said first dielectric portions, a first dielectric layer thinner than said first dielectric portions;
   forming a conductive layer directly on said first dielectric layer and said first dielectric portions;
   forming a second dielectric layer on said conductive layer, wherein said second dielectric layer is formed in a non-conforming manner;
   anisotropically etching said second dielectric layer without a photolithographic pattern, the anisotropically etching step forming first dielectric spacers on portions of the conductive layer;
   etching said conductive layer while using the first dielectric spacers as a mask, the etching said conductive layer forming, from the conductive layer, a first gate electrode having a top and a lateral edge substantially aligned with a lateral edge of one of the first dielectric spacers; and
   defining, between said first gate electrode and said substrate, second dielectric portions in said first dielectric layer, said second dielectric portions being in contact with said first dielectric portions, wherein said anisotropically etching step leaves portions of said second dielectric layer to cover the top of said first gate electrode, the defining the second dielectric portions resulting in each of the second dielectric portions having a lateral edge substantially aligned with a corresponding lateral edge of the first dielectric spacers.

8. A manufacturing method according to claim 7, further comprising:
   depositing a third dielectric layer on said semiconductor substrate.

9. A manufacturing method according to claim 8, further comprising:
   etching said third dielectric layer, wherein etching said third dielectric layer forms second dielectric spacers contacting side walls of said first gate electrode and contacting side walls of said first dielectric spacers, and leaves said second dielectric layer to cover the top of said gate electrode.

10. A manufacturing method according to claim 9, further comprising forming a soft trench in the semiconductor substrate, said soft trench being aligned with said second dielectric spacers.

11. A manufacturing method, comprising:
   forming, on said a semiconductor substrate, first dielectric portions having a first thickness, each first dielectric portion having an upper surface;

forming, on portions of said semiconductor substrate not covered by said first dielectric portions, a first dielectric layer thinner than said first dielectric portions;

forming a conductive layer directly on said first dielectric layer and said first dielectric portions;

forming a second dielectric layer on said conductive layer, wherein said second dielectric layer is formed in a conforming manner;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive layer forming, from the conductive layer, a first gate electrode having a top and a lateral edge substantially aligned with a lateral edge of one of the first dielectric spacers, wherein said etching step removes said second dielectric layer and said conductive layer from the upper surfaces of said first dielectric portions and forms the first gate electrode on a side wall of one of the first dielectric portions;

defining, between said first gate electrode and said substrate, second dielectric portions in said first dielectric layer, said second dielectric portions being in contact with said first dielectric portions, the defining the second dielectric portions resulting in each of the second dielectric portions having a lateral edge substantially aligned with a corresponding lateral edge of the first dielectric spacers;

depositing a third dielectric layer on said semiconductor substrate; and etching said third dielectric layer, wherein etching said third dielectric layer forms second dielectric spacers contacting the side walls of said gate electrode and contacting said first dielectric spacers, and leaves said third dielectric layer to cover the top of said gate electrode and of said first dielectric portions.

12. A manufacturing method according to claim 11, further comprising forming a soft trench in the semiconductor substrate being aligned with said second dielectric spacers.

13. A method, comprising:

forming, on a semiconductor substrate, a first dielectric portion having a first thickness and an upper surface;

forming, on portions of said semiconductor substrate not covered by said first dielectric portion, a first dielectric layer having a second thickness, said second thickness being less than said first thickness;

forming a conductive layer directly on said first dielectric layer and said first dielectric portion;

forming a second dielectric layer on said conductive layer;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive layer forming, from the conductive layer, a first gate electrode extending along, and in contact with, a side wall of the first dielectric portion, the first gate electrode having a lateral edge substantially aligned with a lateral edge of one of the first dielectric spacers; and defining, between said first gate electrode and said substrate, a second dielectric portion of said dielectric layer, said second dielectric portion being auto-aligned with said first dielectric portion, the defining the second dielectric potions resulting in each of the second dielectric portions having a lateral edge substantially aligned with a corresponding lateral edge of the first dielectric spacers, wherein the etching said conductive layer completely removes the conductive layer from the upper surface of the first dielectric portion.

14. The method of claim 13, further comprising:

forming, on said substrate, a third dielectric portion having the first thickness and an upper surface;

forming the conductive layer on said third dielectric portion;

etching said conductive layer to form a second gate electrode extending along, and in contact with, a side wall of the third dielectric portion; and forming in the substrate a doped region using the first and second dielectric spacers as a mask.

15. A manufacturing method, comprising:

forming, on a semiconductor substrate, first dielectric portions having a first thickness, each first dielectric portion having an upper surface;

forming, on portions of said semiconductor substrate not covered by said first dielectric portions, a first dielectric layer thinner than said first dielectric portions;

forming a conductive layer on said first dielectric layer and said first dielectric portions;

forming a second dielectric layer on said conductive layer;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive layer forming, from the conductive layer, a first gate electrode having a top and a lateral edge substantially aligned a with a lateral edge of one of the first dielectric spacers; and defining, between said first gate electrode and said substrate, a second dielectric portion in said first dielectric layer, said second dielectric portion being in contact with one of said first dielectric portions, wherein the etching said conductive layer step forms the first gate electrode along, and in contact with, a first side wall of the one of the first dielectric portions, wherein the etching said conductive layer step forms a second gate electrode along, and in contact with, a second side wall of the one of the first dielectric portions, the etching said conductive layer step removing the conducting layer from the top of the one of the first dielectric portions such that the second gate electrode is spaced apart from the first gate electrode.

16. The method of claim 15, further comprising:

forming a second dielectric spacer that contacts a side wall of one of the first dielectric spacers, a side wall of the first gate electrode, and a side wall of the second dielectric portion; and forming in the substrate a trench using the second dielectric spacer as a mask.

17. A manufacturing method, comprising:

forming, on a semiconductor substrate, first dielectric portions having a first thickness, each first dielectric portion having an upper surface;

forming, on portions of said semiconductor substrate not covered by said first dielectric portions, a first dielectric layer thinner than said first dielectric portions;

forming a conductive layer on said first dielectric layer and said first dielectric portions;

forming a second dielectric layer on said conductive layer;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive layer forming, from the conductive layer, a first gate electrode having a top and a lateral edge substantially aligned with a lateral edge of one of the first dielectric spacers; and defining, between said first gate electrode and said substrate, second dielectric portions in said first dielectric layer, said second dielectric portions being in contact with said first dielectric portions, wherein the etching said conductive layer step forms the first gate electrode along, and in contact with, a first side wall of one of the first dielectric portions, wherein the etching said conductive layer step forms the first gate electrode along, and in contact with, a second side wall of the one of the first dielectric portions, the first gate electrode also covering the upper surface of the one of the first dielectric portions.

18. The method of claim 17 wherein the etching step forms a second gate electrode along, and in contact with, a sidewall of another one of the first dielectric portions and also forms a second dielectric spacer on the second gate electrode, the method further comprising:

forming in the substrate a doped region using the second dielectric spacer and one of the first dielectric spacers as a mask.

19. A method, comprising:

forming, on a semiconductor substrate, a first dielectric portion having a first thickness and an upper surface;

forming, on portions of said semiconductor substrate not covered by said first dielectric portion, a first dielectric layer having a second thickness, said second thickness being less than said first thickness;

forming a conductive layer on said first dielectric layer and said first dielectric portion;

forming a second dielectric layer on said conductive layer;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive forming, from the conductive layer, a first gate electrode extending along, and in contact with, a side wall of the first dielectric portion, and having a lateral edge substantially aligned with a lateral edge of one of the first dielectric spacers; and defining, between said first gate electrode and said substrate, a second dielectric portion of said first dielectric layer, said second dielectric portion being auto-aligned with said first dielectric portion, wherein the etching said conductive layer step forms a second gate electrode along, and in contact with, a second side wall of the first dielectric portion, the etching said conductive layer step removing the conducting layer from the top of the first dielectric portion such that the second gate electrode becomes spaced apart from the first gate electrode.

20. The method of claim 19, further comprising:

forming a third dielectric layer that contacts the top of the first dielectric portion, both of the gate electrodes, and a side wall of the second dielectric portion; and forming in the substrate a trench using the third dielectric layer as a mask.

21. A method, comprising:

forming, on said substrate, a first dielectric portion having a first thickness and an upper surface;

forming, on portions of said semiconductor substrate not covered by said first dielectric portion, a first dielectric layer having a second thickness, said second thickness being less than said first thickness;

forming a conductive layer on said first dielectric layer and said first dielectric portion;

forming a second dielectric layer on said conductive layer;

anisotropically etching said second dielectric layer without a photolithographic pattern, the anisotropically etching step forming a first dielectric spacer on a portion of the conductive layer;

etching said conductive layer while using the first dielectric spacer as a mask, the etching said conductive layer forming, from the conductive layer, a first gate electrode extending along, and in contact with, a side wall of the first dielectric portion, and having a lateral edge substantially aligned with a lateral edge of one of the first dielectric spacers; and defining, between said first gate electrode and said substrate, a second dielectric portion of said first dielectric layer, said second dielectric portion being auto-aligned with said first dielectric portion, wherein the etching said conductive layer step forms the first gate electrode along, and in contact with, a second side wall of the first dielectric portion, the first gate electrode also covering the upper surface of the first dielectric portion.

22. The method of claim 16, further comprising:

forming, on said substrate, a third dielectric portion having the first thickness and an upper surface;

forming the conductive layer on said third dielectric portion;

etching said conductive layer to form a second gate electrode extending along, and in contact with, a side wall of the third dielectric portion;

forming a second dielectric spacer on the second gate electrodes; and forming in the substrate a doped region using the first and second dielectric spacers as a mask.

23. A method, comprising:

forming, on said substrate, a first dielectric portion having a first thickness and an upper surface;

forming, on portions of said semiconductor substrate not covered by said first dielectric portion, a first dielectric layer having a second thickness, said second thickness being less than said first thickness;

forming a conductive layer on said first dielectric layer and said first dielectric portion;

forming a second dielectric layer on said conductive layer;

anisotropically etching said second dielectric layer without a photolithographic pattern, the anisotropically etching step forming first dielectric spacers on portions of the conductive layer;

etching said conductive layer while using the first dielectric spacers as a mask, the etching said conductive layer forming, from the conductive layer, a first gate electrode extending along, and in contact with, a side wall of the first dielectric portion, and having a lateral edge substantially aligned with a lateral edge of one of the first dielectric spacers; and defining, between said first gate electrode and said substrate, a second dielectric portion of said first dielectric layer, said second dielectric portion being auto-aligned with said first dielectric portion, wherein defining the second dielectric portion includes etching the first dielectric layer using the first gate electrode as a mask.

24. The method of claim 23, further comprising:

forming a third dielectric layer that contacts the first gate electrode and a side wall of the second dielectric portion; and forming in the substrate a trench using the third dielectric layer as a mask.

25. A method of manufacturing a power device integrated on a semiconductor substrate, comprising:

forming on the substrate a first dielectric portion;

forming on the substrate a second dielectric portion that is thinner than the first dielectric portion, the second dielectric portion contacting a first side wall of the first dielectric portion;

forming on the substrate a third dielectric portion that is thinner than the first dielectric portion, the third dielectric portion contacting a second side wall of the first dielectric portion, the second side wall being an opposite side wall of the first dielectric portion compared to the first side wall;

forming on the second dielectric portion a first conductive portion that extends along the first side wall of the first dielectric portion;

forming on the third dielectric portion a second conductive portion that extends along the second side wall of the first dielectric portion;

forming in the substrate a first doped region under the second dielectric portion;

forming in the substrate a second doped region under the third dielectric portion; and forming a dielectric layer on the first dielectric portion and the first and second conductive portions to insulate the first and second conductive portions from one another, wherein the second and third dielectric portions are formed simultaneously and have the same thickness.

26. The method of claim 25 wherein the first conductive portion is electrically connected to the second conductive portion by a third conductive portion that is formed on a top surface of the first dielectric portion.

27. The method of claim 25, wherein the first conductive portion has an upper surface and a side wall, the method further comprising forming on the first conductive portion a spacer that covers the upper surface and the side wall of the first conductive portion.

28. A method, comprising:

forming on the substrate a first dielectric portion;

forming on the substrate a second dielectric portion that is thinner than the first dielectric portion, the second dielectric portion contacting a first side wall of the first dielectric portion;

forming on the substrate a third dielectric portion that is thinner than the first dielectric portion, the third dielectric portion contacting a second side wall of the first dielectric portion, the second side wall being an opposite side wall of the first dielectric portion compared to the first side wall;

forming on the second dielectric portion a first conductive portion that extends along the first side wall of the first dielectric portion;

forming on the third dielectric portion a second conductive portion that extends along the second side wall of the first dielectric portion;

forming in the substrate a first doped region under the second dielectric portion;

forming in the substrate a second doped region under the third dielectric portion, wherein the first conductive portion has an upper surface and a side wall; and forming on the first conductive portion a dielectric spacer that covers the upper surface and the side wall of the first conductive portion, wherein forming the first conductive portion includes etching a conductive layer while using the dielectric spacer as a mask; wherein forming the second dielectric portion includes forming a dielectric layer on the substrate and etching the dielectric layer using the dielectric spacer as a mask.

29. The method of claim 28 wherein the dielectric spacer is a first dielectric spacer and the side wall of the first conductive portion is a first side wall, the method further comprising:

forming a second dielectric spacer that contacts a side wall of the first dielectric spacer, a second side wall of the first conductive portion, and a side wall of the second dielectric portion; and forming in the substrate a trench using the second spacer as a mask.

* * * * *

UNITED STATES PATENT AND TRADEMARK OFFICE
CERTIFICATE OF CORRECTION

PATENT NO. : 7,344,966 B2  Page 1 of 1
APPLICATION NO. : 10/901920
DATED : March 18, 2008
INVENTOR(S) : Giuseppe Currò

It is certified that error appears in the above-identified patent and that said Letters Patent is hereby corrected as shown below:

Column 12
Line 8, "forming, on said substrate" should read as -- forming, on a semiconductor substrate --

Column 12
Line 37, "The method of claim 16, further comprising:" should read as -- The method of claim 21, further comprising: --

Column 12
Line 50, "forming, on said substrate" should read as -- forming, on a semiconductor substrate --

Column 14
Line 7, "forming on the substrate" should read as -- forming on a substrate --

Signed and Sealed this

Fourth Day of November, 2008

JON W. DUDAS
*Director of the United States Patent and Trademark Office*